United States Patent [19]
Baird et al.

[11] Patent Number: 5,590,141
[45] Date of Patent: Dec. 31, 1996

[54] METHOD AND APPARATUS FOR GENERATING AND EMPLOYING A HIGH DENSITY OF EXCITED IONS IN A LASANT

[75] Inventors: Brian Baird, Oregon City; Richard DeFreez, Hillsboro; Yunlong Sun, Portland, all of Oreg.

[73] Assignee: Electro Scientific Industries, Inc., Portland, Oreg.

[21] Appl. No.: 262,919

[22] Filed: Jun. 20, 1994

Related U.S. Application Data

[63] Continuation-in-part of Ser. No. 873,449, Apr. 24, 1992, Pat. No. 5,323,414, and Ser. No. 251,475, May 31, 1994, Pat. No. 5,559,824, which is a continuation-in-part of Ser. No. 873,408, Apr. 24, 1992, Pat. No. 5,317,447.

[51] Int. Cl.$^6$ ..................................... H01S 3/091
[52] U.S. Cl. ............... 372/10; 372/25; 372/70; 372/75
[58] Field of Search ................ 372/10, 25, 70, 372/75

[56] References Cited

U.S. PATENT DOCUMENTS

| | | | |
|---|---|---|---|
| 3,982,201 | 9/1976 | Rosenkrantz et al. | 331/94.5 P |
| 4,553,238 | 11/1985 | Shaw et al. | 372/6 |
| 4,688,884 | 8/1987 | Scifres et al. | 350/96.15 |
| 4,701,929 | 10/1987 | Baer et al. | 372/71 |
| 4,710,940 | 12/1987 | Sipes, Jr. | 372/75 |
| 4,723,257 | 2/1988 | Baer et al. | 372/108 |
| 4,731,794 | 3/1988 | Schafer | 372/70 |
| 4,761,786 | 8/1988 | Baer | 372/10 |
| 4,763,975 | 8/1988 | Scifres et al. | 350/96.15 |
| 4,827,485 | 5/1989 | Scerbak et al. | 372/107 |
| 5,022,043 | 6/1991 | Jacobs et al. | 372/95 |
| 5,036,220 | 7/1991 | Byer et al. | 307/427 |
| 5,086,433 | 2/1992 | Pochelle et al. | 372/72 |
| 5,159,605 | 10/1992 | Yagi et al. | 372/75 |
| 5,260,963 | 11/1993 | Baird et al. | 372/95 |
| 5,265,114 | 11/1993 | Sun et al. | 372/10 |
| 5,287,381 | 2/1994 | Hyuga et al. | 372/75 |
| 5,317,447 | 5/1994 | Baird et al. | 372/75 |
| 5,323,414 | 6/1994 | Baird et al. | 372/70 |

FOREIGN PATENT DOCUMENTS

| | | | |
|---|---|---|---|
| 0346951 | 12/1989 | European Pat. Off. | H10S 3/06 |

OTHER PUBLICATIONS

Hughes, D. W. et al., "Laser Diode Pumped Solid State Lasers," *Journal of Physics D: Applied Physics*, vol. 25 (14 Apr., 1992), No. 4, Bristol, GB, pp. 563–586.

Mermilliod, N. et al., "LaMgAl$_{11}$O$_{19}$:Nd Microchip Laser," *320 Applied Physics Physics Letters*, vol. 59, No. 27, (Dec. 1991), New York, U.S., pp. 3519–3520.

Plaessman et al., "Reducing Pulse Durations in Diode Pumped Q-Switched Solid-State Lasers", *IEEE Photonics Technology Letters*, vol. 3, No. 10, (Oct. 1991), New York, U.S., pp. 886–887.

Tilton ... DeFreez et al., "High Power, Nearly Diffraction-Limited Output from a Semiconductor Laser with an Unstable Resonator," *IEEE Journal of Quantum Electronics*, 2098–2108, vol. 27, No. 9 (Sep. 1991).

Winston, "Nonimaging Optics," *Scientific American*, vol. 264, No. 3 (Mar. 1991).

Dixon, G. J., "Nonlinear Optical Techniques for Frequency Upconversion of Laser Diodes," LEOS '90, IEEE Lasers and Electro-Optics Society Annual Meeting Conference Proceedings, vol. 2 (Nov. 4–9, 1990), Boston, MA, U.S., pp. 138–141.

(List continued on next page.)

*Primary Examiner*—Rodney B. Bovernick
*Assistant Examiner*—Yisun Song
*Attorney, Agent, or Firm*—Stoel Rives LLP

[57] ABSTRACT

A laser system uses a broad-area high-power diode laser in cooperation with a nonimaging concentrator, or an unstable resonator semiconductor laser, to end pump a relatively thin, solid-state, highly doped lasant. The laser system generates a very high density of excited ions in the lasant mode volume to produce high peak power pulses having comparable magnitudes over a wide range of pulse repetition frequencies.

24 Claims, 8 Drawing Sheets

OTHER PUBLICATIONS

G. J. Dixon and L. S. Lingvay, "Close–Coupled Pumping of an Intracavity–Doubled Lithium Neodymium Tetraphosphate Laser," *Solid State Lasers* (1990), pp. 291–293 (no month available).

Walling, J. C. et al., "Tunable Alexandrite," *IEEE Journal of Quantum Electronics*, vol. QE–21, No. 10 (Oct. 1985), pp. 1568–1581.

D. G. Hall, "Optimum Mode Size Criteria for Low Gain Lasers," *Applied Optics*, vol. 20 (May 1, 1981), pp. 1579–1583.

Kubodera and Otsuka, "Efficient $LiNdP_4O_{12}$ Lasers Pumped With a Laser Diode," *Applied Optics*, vol. 18, No. 23 (Dec. 1, 1979).

Thompson, "A Theory for Filamentation in Semiconductor Lasers," *Optoelectronics*, vol. 4 (1972), pp. 257–310 Jun.

Chesler et al., "An Experimental and Theoretical Study of High Repitition Rate Q–Switched Nd:YAG Lasers," vol. 58, No. 12 (Dec. 1970), pp. 1899–1914.

Wagner and Lengyel, "Evolution of the Giant Pulse in a Laser," *Journal of Applied Physics*, vol. 34, No. 7 (Jul. 1963), pp. 2040–2046.

"Laser Diode Guide Book," Sony Corporation of America, p. 52 (no date available).

METHOD AND APPARATUS FOR GENERATING AND EMPLOYING A HIGH DENSITY OF EXCITED IONS IN A LASANT

This is a continuation-in-part of U.S. patent application Ser. No. 07/873,449, filed Apr. 24, 1992, which issued as U.S. Pat. No. 5,323,414 on Jun. 21, 1994 and a continuation-in-part of U.S. patent application Ser. No. 08/251,475, filed May 31, 1994, which issued as U.S. Pat. No. 5,559,824, of Baird and DeFreez for Optical Nonlinear Waveguide Pumped by Unstable Resonator Semiconductor Laser, which is a continuation-in-part of Ser. No. 873,408 filed Apr. 24, 1992, U.S. Pat. No. 5,317,447, which issued on May 31, 1994.

TECHNICAL FIELD

The invention relates to lasers and, in particular, to a method and an apparatus for generating a high density of excited ions within a solid-state lasant of a Q-switched laser to generate high peak power pulses having comparable magnitudes over a wide range of pulse repetition frequencies.

BACKGROUND OF THE INVENTION

The background description is presented herein only by way of example to methods for employing semiconductor lasers to pump solid-state diode lasers. For example, in U.S. Pat. No. 3,982,201, Rosenkrantz et al. describe a solid-state laser that is pumped by single diodes or arrays of diodes to which the laser rod is directly end-coupled. Because the output wavelength of the diode laser array is a function of its temperature, the diode lasers are operated in a pulsed mode at a low duty cycle to maintain the array at a low enough temperature so that its output wavelength remains matched to the absorption bandwidth of the solid-state laser rod. The output power characteristics of this laser system are limited by the relatively inefficient match between the output of the diode lasers and mode volume of the solid-state laser rod.

In "Efficient $LiNdP_4O_{12}$ Lasers Pumped with a Laser Diode," *Applied Optics*, vol 18, No. 23 (Dec. 1, 1979), Kubodera and Otsuka describe the well-known practice of collecting the output light of a diode laser and focusing its expanded output light using conventional lenses, such as two microscope condenser lenses. This method is particularly well suited for applications where the emitter width and divergence of the diode laser are small. However, as the emitter dimensions and beam divergence increase, it becomes increasingly difficult to efficiently collect the output beam with collimating lens or lenses. It also becomes more difficult to focus the expanded beam into the solid-state laser crystal with sufficient depth of focus to allow efficient overlap of the pump beam throughout the resonator mode volume within the lasant.

In U.S. Pat. No. 4,710,940, Sipes, Jr. describes a neodymium:yttrium aluminum garnet (Nd:YAG) solid-state laser that is end-pumped by a diode laser array or by two diode laser arrays that have been combined by use of polarizing beam-splitting cubes. Sipes, Jr., cites the analysis of D. G. Hall in "Optimum Mode Size Criteria for Low Gain Lasers," *Applied Optics*, 1579–1583, vol. 20, (May 1, 1981), to suggest that the "pump profile shape does not matter much as long as all the pump light falls within the resonator mode." Sipes, Jr., notes, however, that Hall's analysis does not account for the divergence properties of Gaussian beams, so Sipes, Jr., suggests that, if required, the cross-section of the pump beam could be modified by use of a cylindrical lens.

In U.S. Pat. No. 4,761,786, Baer describes a Q-switched, solid-state laser that is end-pumped by a diode laser or diode laser array. The output light from the pump source is collected by a collimating lens and directed by a focusing lens to end-pump the laser rod. Baer notes that "other lenses to correct astigmatism may be placed between the collimating lens and focusing lens." Baer also describes an alternate embodiment that employs a remotely positioned diode laser pumping source coupled through an optical fiber, the output of which is focused via a lens into the laser rod.

In U.S. Pat. No. 4,763,975, Scifres et al. describe two optical systems that produce bright light output for a variety of applications, including pumping a solid-state laser such as a Nd:YAG. Scifres et al. describe an optical system that employs a plurality of diode lasers, each of which is coupled into one of a plurality of fiber-optic waveguides. The waveguides are arranged to form a bundle that delivers the light generated by the diode laser sources to the output end of the bundle. Optics, such as a lens, may be used to focus the light into a solid-state laser medium. Alternatively, the fiber bundle may be end-, and more specifically, "butt"-coupled to the laser rod (end-coupled and very close to or in contact with the laser rod).

Scifres et al. describe another optical system that employs a diode laser bar, broad-area laser, or other elongated source to pump a solid-state laser. The diode laser bar light output is coupled into a fiber-optic waveguide having an input end that has been squashed to be elongated and thereby have core dimensions and lateral and transverse numerical apertures that correspond respectively to those of emission dimension and lateral and transverse divergence angles of the laser bar. The output light from the fiber-optic waveguide is either focused using a lens into the end of the solid-state laser rod or butt-coupled to the rod. Scifres et al. state that either end of the fiber-optic waveguide can be curved. Although these methods attempt to match the output light from the fiber-optic waveguide to the resonant cavity mode of the solid-state laser, they are limited in efficiency by the numerical aperture of the sources that can be effectively collected and guided by the fiber-optic waveguides.

Solid-state lasers such as some of those described above may be employed in a variety of industrial operations including inspecting or microprocessing substrates such as electronic materials. The following description is presented herein only by way of example to Q-switched, diode-pumped, solid-state lasers employed for link processing during a semiconductor memory device repair operation.

For example, to repair a dynamic random access memory (DRAM), a first laser pulse is used to remove a conductive link to a faulty memory cell of a DRAM device, and then a second laser pulse is used to remove a resistive link to a redundant memory cell to replace the faulty memory cell. Because faulty memory cells needing link removals are randomly located, such laser repair processes are typically performed over a wide range of pulse repetition frequencies (PRFs), rather than at a constant PRF. This production technique is referred to in the industry as "on the fly" (OTF) link processing and allows for greater efficiency in the rate at which links on a given wafer can be repaired, thereby improving the efficiency of the entire DRAM production process.

The laser industry typically employs Q-switched, diode-pumped lasers (DPLs) using solid-state, neodymium-doped crystals to perform DRAM memory repair operations. DPLs are preferred over conventional arc-pumped Nd:YAG lasers for these operations because DPLs offer increased pumping source lifetimes. The typical mean time between failure (MTBF) is greater than 10,000 hours for diode-pumped lasers, whereas the typical MTBF is fewer than 1000 hours for arc-pumped lasers. In addition, DPLs do not require the water-cooling systems needed for arc-pumped lasers and are, therefore, better suited for operation in a clean-room environment. The previously described laser system of Baer is representative of such a laser system.

Laser energy per pulse typically decreases with increasing PRF, which is the inverse of the interpulse period (which is the length of time between the pulses emitted by the laser), and depends on the effective fluorescence lifetime of the metastable state of excited dopant or active ions in the crystal or lasant. For Q-switched, solid-state lasers, the laser pulse energies display a characteristic roll-off as the interpulse period decreases. This energy per pulse roll-off limits the upper PRF range for many laser memory repair processes. Each combination of epitaxial growth technique, material choice, and laser system design determines an acceptable range of deviation, often called a "process window" for pulse energies that will efficiently process the links. For many memory devices, the "process window" requires that laser pulse energy vary by less than 5% from a selected energy value.

Diode-pumped lasers, especially those employing neodymium:yttrium lithium fluoride (Nd:YLF) lasants, for example, are unable to limit pulse energy roll-off to less than 5% for PRFs>1000 Hz because of the relatively long (500 µsec) fluorescence lifetime of excited neodymium ions from the metastable state in a YLF lasant. DRAM memory repair applications typically employ a Nd:YLF lasant, however, because other useful lasant materials such as Nd:YAG are difficult to pump reliably using laser diodes and often exhibit pulse energy instability. The pulse energy instability can result from a mismatch between the spectral linewidths of the available high power, gain-guided aluminum gallium arsenide (AlGaAs) diode lasers and the absorption bandwidths of the most efficient lasants. The typical value of the full width, half-maximum spectral bandwidth for high power, gain-guided AlGaAs diode lasers is about 4 nm. Thus, while Nd:YAG has an absorption bandwidth of approximately 2 nm at 810 nm, Nd:YLF has a more closely matched absorption bandwidth of about 4 nm at 798 nm.

Neodymium:yttrium vanadate (Nd:YVO$_4$) is another lasant that can be pumped by AlGaAs diode lasers. Nd:YVO$_4$ has, however, a relatively low single ion fluorescence lifetime (typically less than 100 µsec), thereby significantly limiting the energy per pulse that can be extracted from a Q-switched Nd:YVO$_4$ laser. This energy per pulse is significantly less than that achievable from a Nd:YLF laser under similar pump power excitation levels. The limited energy per pulse of a Q-switched Nd:YVO$_4$ laser can be a severe disadvantage whenever beam-shaping or other low-transmission laser optics are employed to direct the laser energy at, for example, metallic conductive links of a DRAM device.

Several neodymium-containing, stoichiometric, solid-state lasants such as lithium neodymium tetraphosphate (LNP) can also be pumped by AlGaAs diode lasers, as described by G. J. Dixon and L. S. Lingvay in "Close-Coupled Pumping of an Intracavity-Doubled Lithium Neodymium Tetraphosphate Laser," *SPIE Solid-State Lasers*, 291–293 vol. 1223 (1990). Stoichiometric neodymium compounds contain a very high neodymium concentration on the order of $10^{21}$ Nd/cm$^3$ and thus have very high absorption coefficients. Solid-state laser crystals such as YLF, in which neodymium ions appear as dopant ions substituting for yttrium ions, have significantly lower neodymium concentrations, typically on the order of $10^{20}$ Nd/cm$^3$.

Dixon and Lingvay employ the higher absorption coefficient of LNP in a diode-pumped LNP laser having a 0.4 mm-thick, LNP lasant crystal directly cemented to the submount of a Spectra Diode Laboratories Model 2240-H, phase-locked, diode laser array. This arrangement permits the LNP lasant to be thermoelectrically cooled to reduce the resonant loss and the energy transfer up-conversion from the laser metastable state that are typically exhibited by stoichiometric neodymium lasant compounds such as LNP. Nonstoichiometric neodymium laser compounds, such as Nd:YLF, do not typically exhibit these disadvantageous phenomena. It is also noted that the device described by Dixon and Lingvay does not include a Q-switch and does not attempt to collect the output of the diode-laser array via an optical system. The output of the diode laser is directly coupled into the LNP lasant crystal.

For the reasons set forth above, Nd:YLF is, therefore, an industry-preferred lasant for DRAM memory repair and silicon trimming operations, despite the limitations Nd:YLF places on the upper useful limit for PRF for OTF processing applications.

The power absorbed by a lasant is typically expressed as:

$$P_a = P_0 e^{-\alpha L}, \tag{1}$$

where $P_a$ is the power absorbed by the lasant; where $P_0$ is the pumping power entering the lasant; where alpha is the absorption coefficient defined as $\alpha = 4\pi k/\lambda$, where k is the extinction coefficient and $\lambda$ is the pumping wavelength; and where L is the length of the lasant. In conventional laser systems, L is much greater than or equal to $1/\alpha$, the absorption depth of the lasant. Conventional nonstoichiometric lasants are fabricated to have length sufficient to absorb most of the energy coupled from a pumping source, even though the total percentage of excited active ions in the lasant mode volume decreases substantially as a function of the length of the lasant.

FIG. 1 shows the effect of PRF and effective fluorescence lifetime on energy per pulse of a Q-switched, solid-state laser. The data presented in FIG. 1 were determined in accordance with the theories of William G. Wagner and Bela A. Lengyel set out in "Evolution of the Giant Pulse in a Laser," *Journal of Applied Physics*, 2040–2046, vol. 34, No. 7, (July 1963) and of R. B. Chesler, M. A. Karr, and J. E. Geusic in "An Experimental and Theoretical Study of High Repetition Rate Q-Switched Nd:YAG Lasers," *Proceedings of the IEEE*, 1899–1914, vol. 58, No. 12 (December 1970).

Mathematical equations that derive the dependence of the energy per pulse on the PRF assume that (1) the total number of excited ions is much smaller than the total number of active ions in the lasant and (2) the only depopulation mechanisms available to excited ions result from spontaneous and stimulated emission. These relationships are expressed as:

$$E_1 = E_0(1 - e^{-at}), \tag{2}$$

where $E_0$ represents the energy per pulse at very low PRFs (<10 Hz); where $E_1$ represents the energy per pulse at a PRF given by the inverse of the interpulse period t; and where the parameter $a = (1/\tau_f + \omega_p)$, where $\tau_f$ is the single ion metastable state fluorescence lifetime of the active ion in the lasant and $\omega_p$ is the pumping rate, the effect of which is negligible at low pumping rates. The inverse of parameter a describes the effective fluorescence lifetime of the metastable state.

SUMMARY OF INVENTION

The assumptions underlying excited active ion density and depopulation mechanisms have been theoretically and experimentally determined to require modification to more accurately represent performance behavior of laser systems of the present invention. These systems employ an efficient means for coupling a high-power pumping source into a lasant mode volume that is preferably selected to maximize the percentage or density of excited active ions in the lasant during pumping. Such modification is especially useful to explain the behavior performance of a laser system employing a highly doped, solid-state lasant with thin platelet or short-length fiber geometry that is longitudinally end-pumped by a high-power diode laser coupled to the lasant through a nonimaging concentrator. The nonimaging concentrator delivers the pumping power emitted by the high-power diode laser into the portion of the mode volume contained within the lasant, the geometry of which has been optimized for maintaining a very high density of excited ions throughout the lasant mode volume.

For laser systems of the present invention that provide a high density of excited active ions in a lasant, the rate equations useful for determining the dependence of the energy per pulse on the PRF include an additional explicit dependence on the pumping rate and on Auger or anti-Stokes mechanisms such as ion-ion interactions and two-photon absorption mechanisms that also depopulate the metastable state of excited active ions. Inclusion of these factors, which apparently become significant only when the total number of excited active ions exceeds 1% of the total number of active ions, leads to a modification of the analytical solution for the dependence of energy per pulse on the PRF. Thus, the value of parameter a in equation (2) is more accurately expressed as:

$$a = (1/\tau_f + \omega_p + B), \qquad (3),$$

where B represents Auger or other depopulation mechanisms including but not limited to ion-ion interactions and two-photon absorption. Experimental results confirm the validity of equation (3) and show that the conventional energy-per-pulse decrease accompanying a PRF increase is reduced by increasing the pumping rate and initiating ion-ion interactions, or two-photon absorption or other depopulation mechanisms.

To maximize the percentage of excited active ions in a lasant, the present invention preferably employs a thin platelet or short-length fiber lasant geometry. This type of lasant geometry is selected to have a length consistent with the method of maintaining a very high density of excited ions throughout the lasant mode volume. In contradistinction, the length of the lasant selected for use in a conventional laser system is chosen mainly on the basis of absorbing the maximum amount of optical power from the pumping beam without consideration of excited active ion density. The present invention further maximizes the excited active ion percentage by preferably employing a nonimaging concentrator to efficiently couple the power emitted from the pumping source into the mode volume contained within the lasant.

An object of the present invention is, therefore, to provide a method and an apparatus for generating a very high density of excited ions within the portion of a resonator mode volume contained within a solid-state lasant of a Q-switched laser to produce high peak power pulses having comparable magnitudes over a wide range of PRFs.

Another object of the invention is to provide such a method and an apparatus that employ a relatively short, end-pumped, solid-state lasant containing a substantially high concentration of active ions in the lasant mode volume.

A further object of the invention is to provide such a method and an apparatus that employ a nonimaging concentrator coupled to a pumping source to efficiently facilitate the generation of a high density of excited ions within the portion of the mode volume contained within the lasant.

Yet another object of the invention is to provide such a method and an apparatus that permit OTF link processing of DRAMS at higher throughput rates.

Still another object of the invention is to provide a method for employing a nonimaging concentrator to very efficiently couple high-power light output from a high-power, single emitter diode laser or diode laser array of single emitters into the end of a solid-state lasant resulting in a compact, integrated, diode-pumped, solid-state laser design.

Such laser system embodiments yield a marked decrease in the roll-off in energy per pulse with increasing PRF, thus making a useful Q-switched DPL for use at PRFs exceeding 1000 Hz.

Additional objects and advantages of the present invention will be apparent from the following detailed description of preferred embodiments thereof, which proceeds with reference to the accompanying drawings.

DETAILED DESCRIPTION OF PREFERRED EMBODIMENTS

Figure 1:
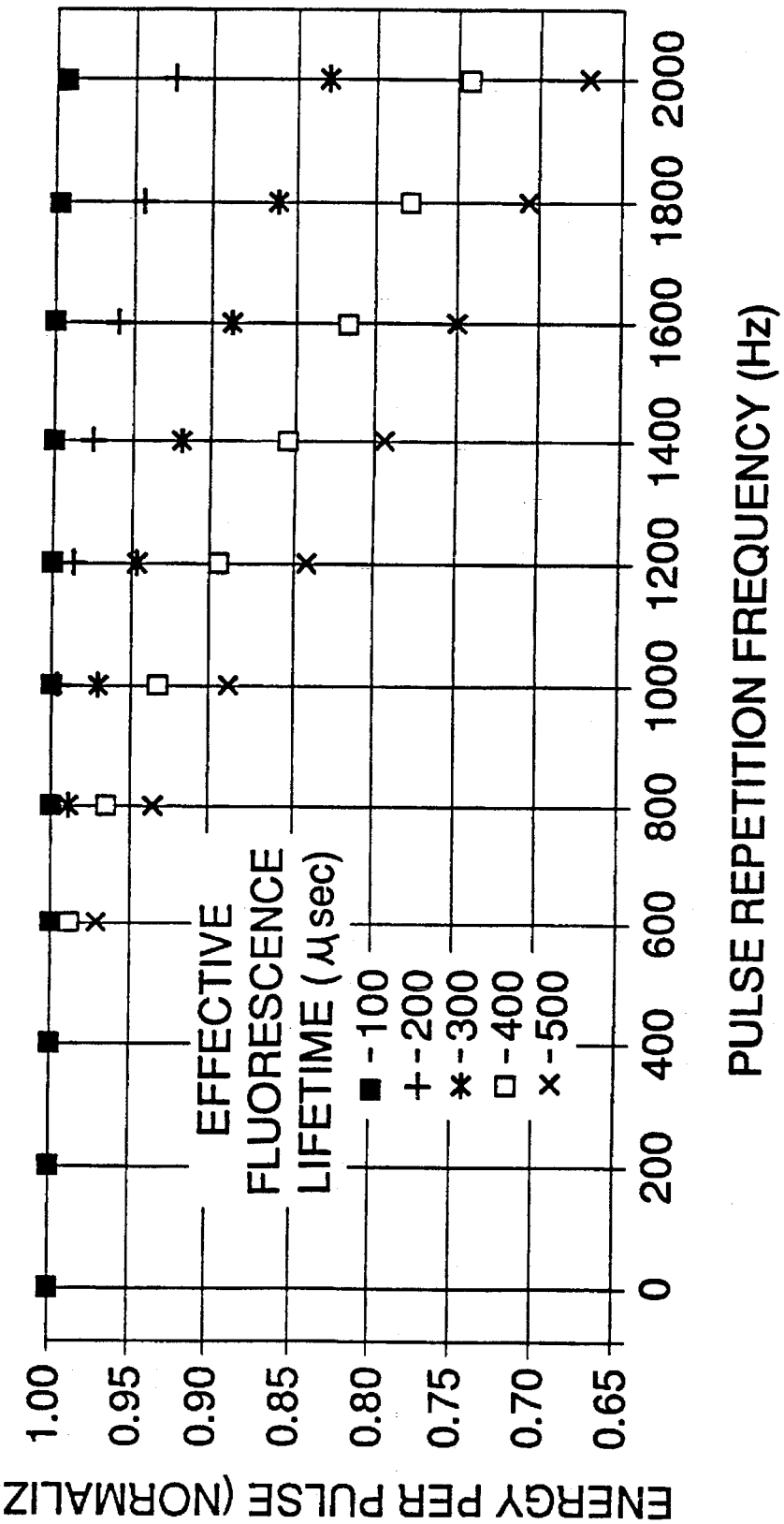
FIG. 1 is a graph showing the effect of PRF and effective fluorescence lifetime on energy per pulse, as known in the prior art.
Figure 2:
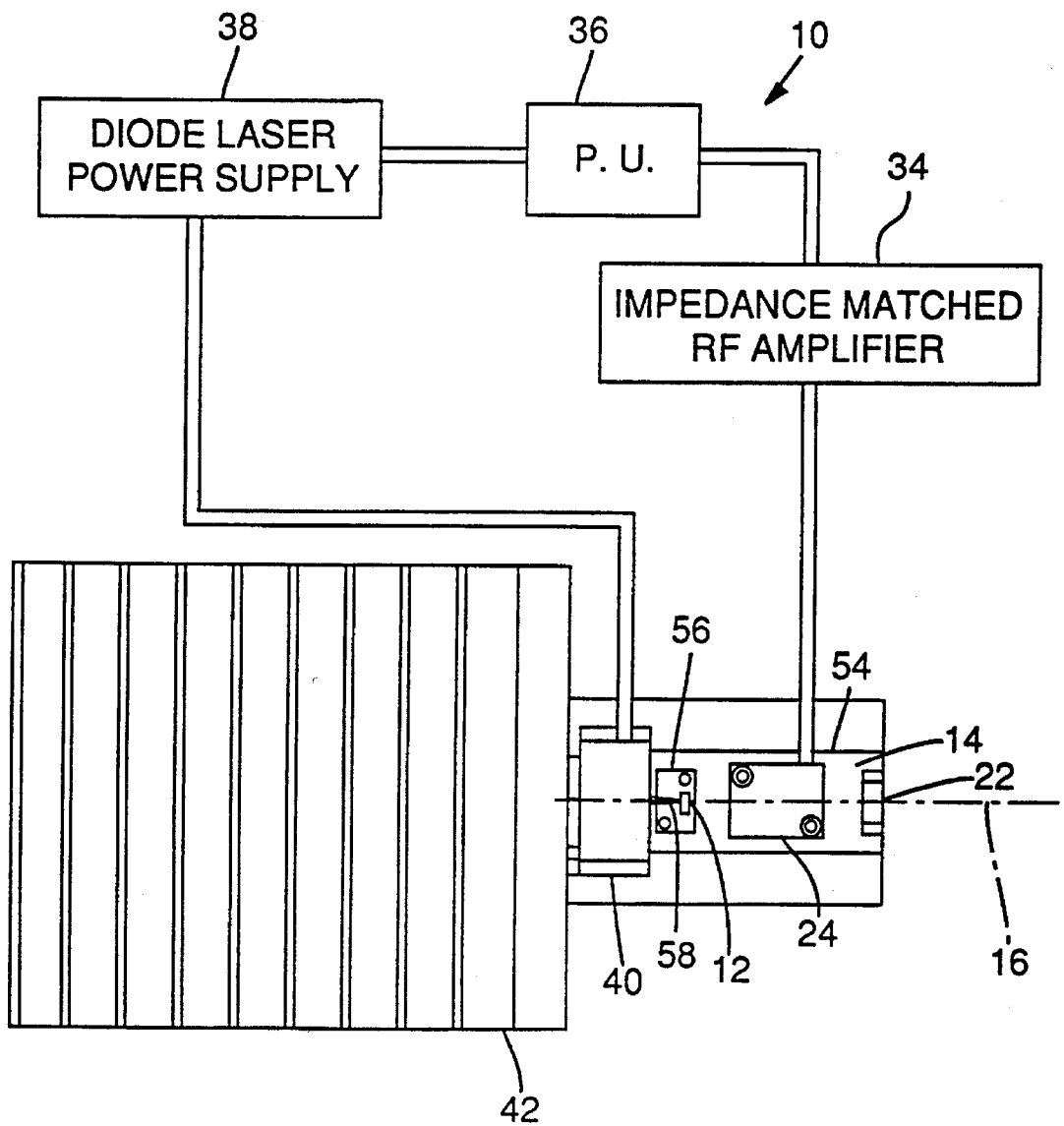
FIG. 2 is a partly schematic plan view of a preferred embodiment of a laser system incorporating a nonimaging concentrator and a short-length lasant in accordance with the present invention.
Figure 3:
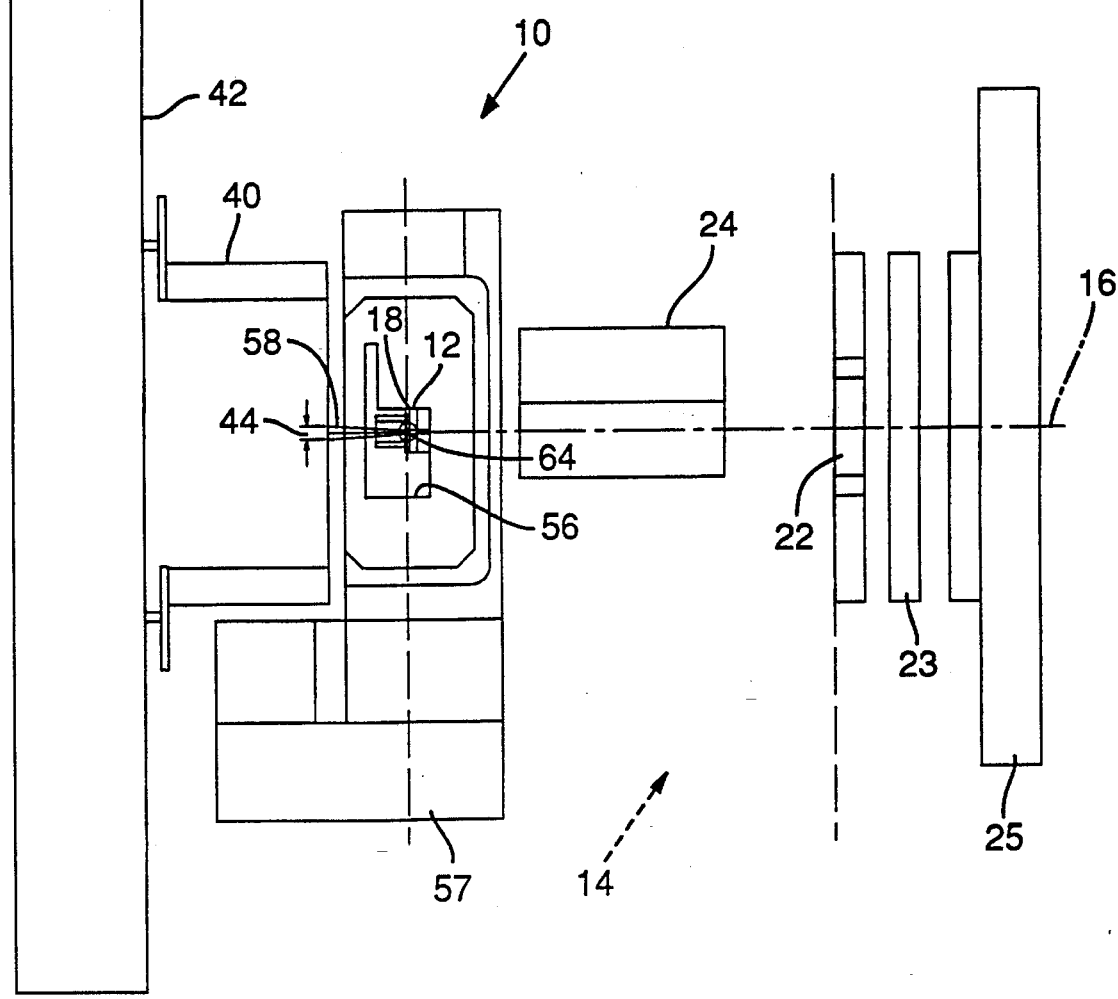
FIG. 3 is a fragmentary, side elevation view, with a portion cut away, of the laser system of FIG. 2.

FIG. 2 is a partly schematic plan view and FIG. 3 is a fragmentary side elevation view of a preferred embodiment of the laser system 10 of present invention. With reference to FIGS. 2 and 3, laser system 10 includes a solid-state lasant 12 positioned within a resonator cavity 14 having approximate dimensions of 75 mm in length, 40 mm in height, and 50 mm in width. Light emitted by lasant 12 propagates along an optic axis 16.

Lasant 12 is, for example, a neodymium-doped crystal such as Nd:YLF. Preferably, the Nd:YLF crystal is fabricated into a platelet having a length of less than 1.25 mm and a rectangular cross-section of about 3 mm×4 mm. The Nd:YLF crystal is selectively cut to align its edges with its π and ρ crystallographic axes to aid in alignment of lasant 12 within resonator cavity 14. The preferred dopant level for Nd:YLF lasants employed in the present invention ranges from about 1.0% to 5.0% atomic. Persons skilled in the art will appreciate that crystal length and dopant level are two parameters concurrently selected to achieve in lasant 12 a density of excited active ions of an amount sufficient to generate advantageous values for the effective fluorescence lifetime of the metastable state. Skilled persons will also appreciate that, as good quality higher dopant level Nd:YLF crystals become available, the length of the crystal platelet can be minimized to optimize excited ion density.

In a preferred embodiment, a dichroic coating 18 (FIG. 4), which is highly transmissive at a preselected laser-diode pump wavelength such as 798 nm and which is highly reflective at a preselected lasant emission wavelength such as 1047 nm, is applied to rear surface 20 (FIG. 4) of lasant 12 to form an input end of resonator cavity 14. Alternatively, a dichroic mirror with a 1.0 m radius of curvature could be used to form the input end of resonator cavity 14. A coupling mirror 22, partly transmissive at the lasant emission wavelength and preferably having a 400 mm radius of curvature, forms the opposite, or output, end of resonator cavity 14. Mirror 22 is secured to a coupler mount 23 that may be positioned via a positioning stage 25. Mirror 22 cooperates with dichroic coating 18 to promote resonator feedback or amplification within resonator cavity 14.

Resonator cavity 14 also includes a modulator 24 interposed along optic axis 16 between lasant 12 and mirror 22. Modulator 24 is preferably an 80 MHz Q-switch that employs an acousto-optic medium 26 (FIG. 4), which is preferably quartz, or SF-57 glass, or other medium having an acceptable figure of merit such as fused silica or $TeO_2$, that is bonded to an acoustic wave transducer (not shown). The acoustic wave transducer receives an RF signal from an impedance matched RF amplifier 34 and is responsive to signals provided by an internal control unit (not shown).

The control unit preferably includes an RF signal oscillator that produces a continuous-wave signal having a variable or preselected frequency that is amplified to a power level determined by a processing unit 36. Processing unit 36 also determines the power level, and perhaps pulse intervals, supplied to a continuous or pulsed power supply 38 that activates a diode laser 40, described later in detail.

In the presence of an RF signal, the transducer generates an acoustic wave that propagates through medium 26 transverse to the optic axis 16 in resonator cavity 14. The acoustic wave functions as a diffraction grating that substantially increases the optical losses in resonator cavity 14 to effectively prevent lasing and consequently enable storage of energy in lasant 12. When the RF signal applied to the transducer is interrupted, the diffraction grating is removed and the optical losses in resonator cavity 14 are diminished. While employing this method, laser system 10 of the present invention can generate short, high-power optical pulses of typically less than 50 ns duration.

Resonator cavity 14 is preferably pumped by a high-power, graded-index separate confinement heterostructure (GRINSCH), AlGaAs, single-emitter diode laser 40, or laser diode array of single emitters, with total optical output power of 3.0 watts or greater that receives electrical current from power supply 38. Diode laser 40 is mounted to a heat sink 42 and positioned in proximity to resonator cavity 14. Diode laser 40 emits from its emission aperture 44 (FIG. 4), a pumping beam 45 (FIGS. 6A and 6B) that travels substantially collinearly with and proximal to optic axis 16. Pumping beam 45 is typically astigmatic and has a noncircular radiation pattern whenever the diode laser 40 is of gain-guided type. High-power, gain-guided, diode lasers are easier to manufacture than high-power, index-guided diode lasers and are, therefore, more widely available, less expensive, and preferred for this invention.

Figure 4:
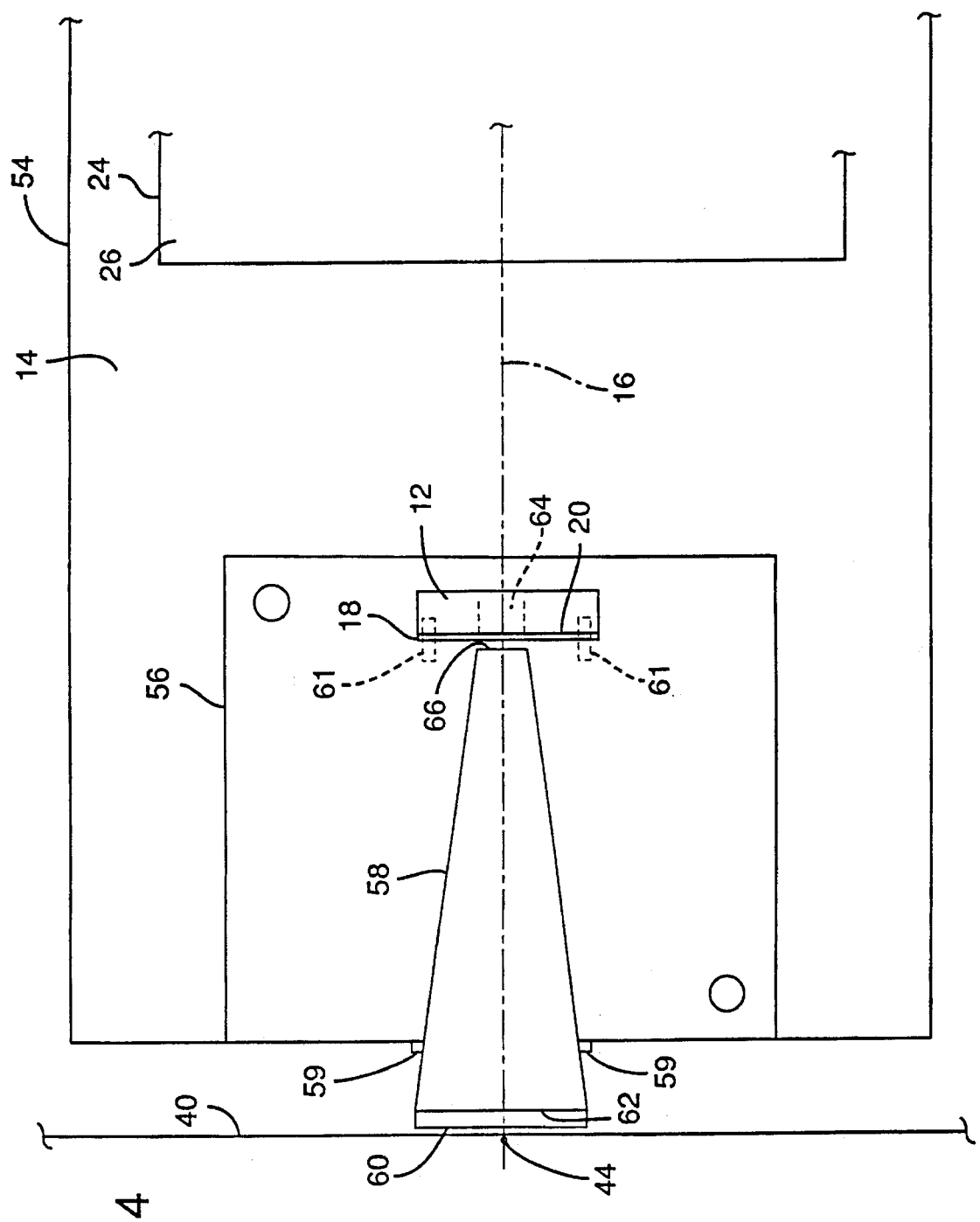
FIG. 4 is an enlarged, fragmentary, plan view of a resonator housing including a nonimaging concentrator coupled to a lasant employed in the laser system of FIG. 2.

FIG. 4 shows an enlarged, fragmentary plan view of resonator housing 54 that encloses a nonimaging concentrator 58 coupled to lasant 12. With reference to FIGS. 3 and 4, precisely machine coupling stage 56 and positioning stage coupler 57 are mounted into resonator housing 54 to facilitate alignment of nonimaging concentrator 58 positioned therein to facilitate optical coupling of diode laser 40 and lasant 12. Coupling stage 56 preferably provides for close end-coupling of nonimaging concentrator 58 to lasant 12 with only a small air gap of less than 10 μm between them. Coupling stage 56 is machined to allow minor orientation adjustments of lasant 12 so that its π and ρ crystallographic axes are properly aligned with respect to optic axis 16. An epoxy or solder is also preferably applied at coupling stage points 59 and in fill holes 61 to secure nonimaging concentrator 58 and lasant 12 to coupling stage 56.

Nonimaging concentrator 58 preferably is of cylindrical shape with a boundary surface having linear taper, which is "best fit" to an ideal compound parabolic concentrator, and is fabricated from sapphire or other high refractive index, crystalline dielectric material. Persons skilled in the art will appreciate that such crystalline material, such as sapphire, is unlike amorphous materials, such as those used for fiber-optic waveguides, and cannot readily be squashed to form elongated shapes such as described by Scifres et al. Nonimaging concentrator 58 also preferably includes a microcylindrical lens 60 ground onto its input aperture 62 to reduce the transverse divergence angle, which is typically larger than the lateral divergence angle, of pumping beam 45 to allow efficient coupling of it from diode laser 40 into lasant mode volume 64 (the portion of the resonator mode volume contained within lasant 12) in resonator cavity 14.

Figure 5:
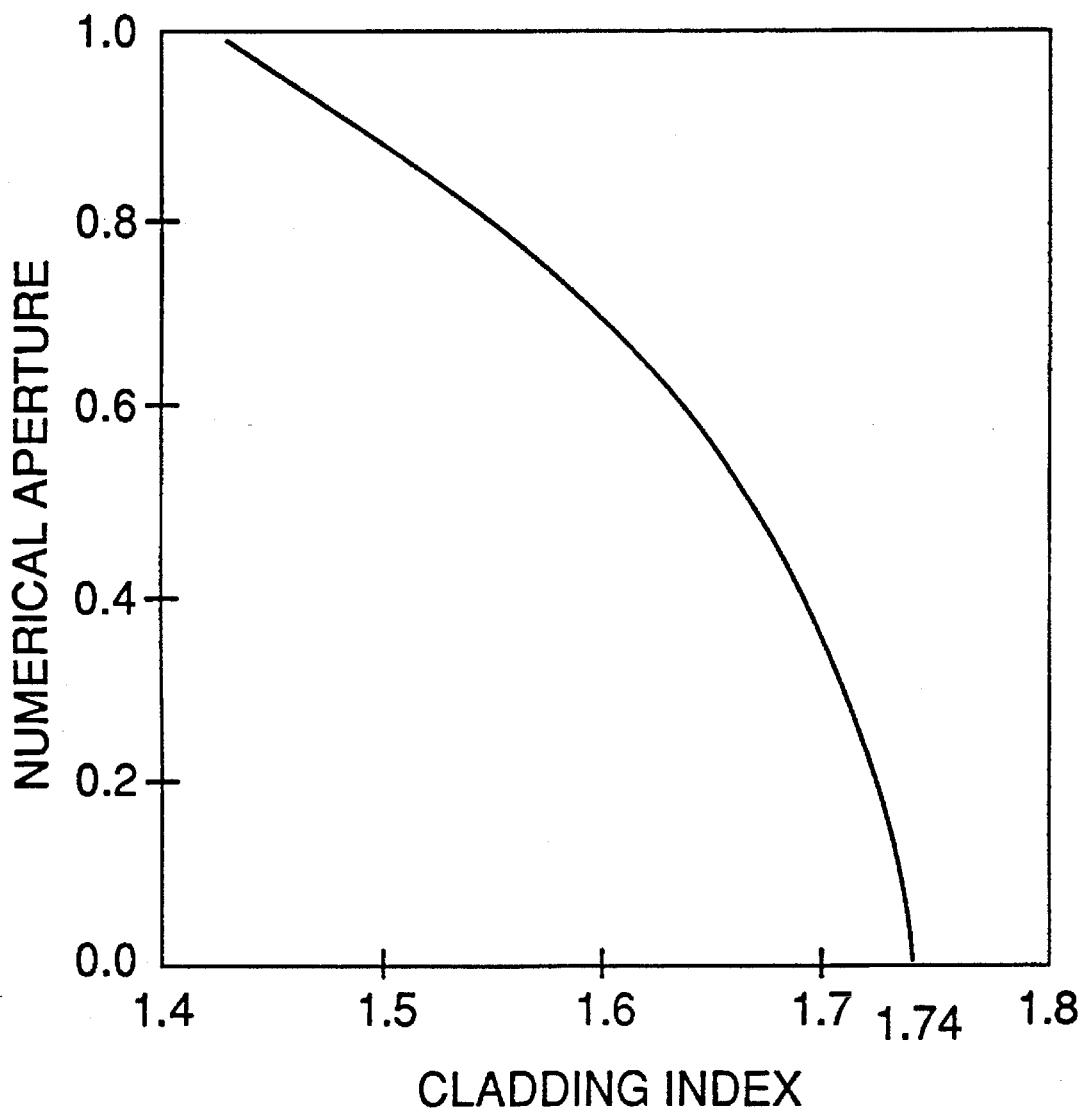
FIG. 5 is a graph showing the numerical aperture of a nonimaging concentrator of refractive index 1.74 of the present invention as a function of the cladding index.

FIG. 5 is a graph showing the numerical aperture of a nonimaging concentrator 58 of refractive index 1.74 as a function of the cladding index. FIG. 5 is not corrected for tilt angle of the concentrator taper, which typically is very small. FIG. 5 demonstrates that a nonimaging concentrator 58 with refractive index 1.74 in air collects all rays not reflected at the interface. In addition to increasing the acceptance angle of input aperture 62, a high refractive index material provides substantial internal reflection, of nearly 100% efficiency, at the boundary surface between input aperture 62 and output aperture 66 of nonimaging concentrator 58. Those skilled in the art will recognize that antireflection coatings can be applied to microcylindrical lens 60 and the output aperture 66 of nonimaging concentrator 58 to greatly reduce reflections at these interfaces. This coupling embodiment is a significant improvement over use of single-mode or multi-mode fiber-optic waveguides with refractive indices of about 1.43, such as those described by Scifres et al. in U.S. Pat. No. 4,673,975. Moreover, the relatively low refractive index step between the transparent core and cladding material characteristic of such fiber-optic waveguides results in a significant numerical aperture limit for Scifres et al.'s devices.

Preferably, nonimaging concentrator 58 has an input aperture 62 that is larger than the width of the active area of emission 44 of diode laser 40 and is of sufficient diameter to intercept essentially all radiation emitted from the diode laser 40. In addition, nonimaging concentrator 58 has an output aperture 66 that is less than the diameter of lasant mode volume 64. The nonimaging coupling of pumping beam 45 from high-power diode laser 40 into lasant mode volume 64 results in an efficient overlap of pumping beam 45 with the lasant mode volume 64, thus minimizing losses which would otherwise occur through divergence of the pumping beam outside lasant mode volume 64.

Figure 6A:
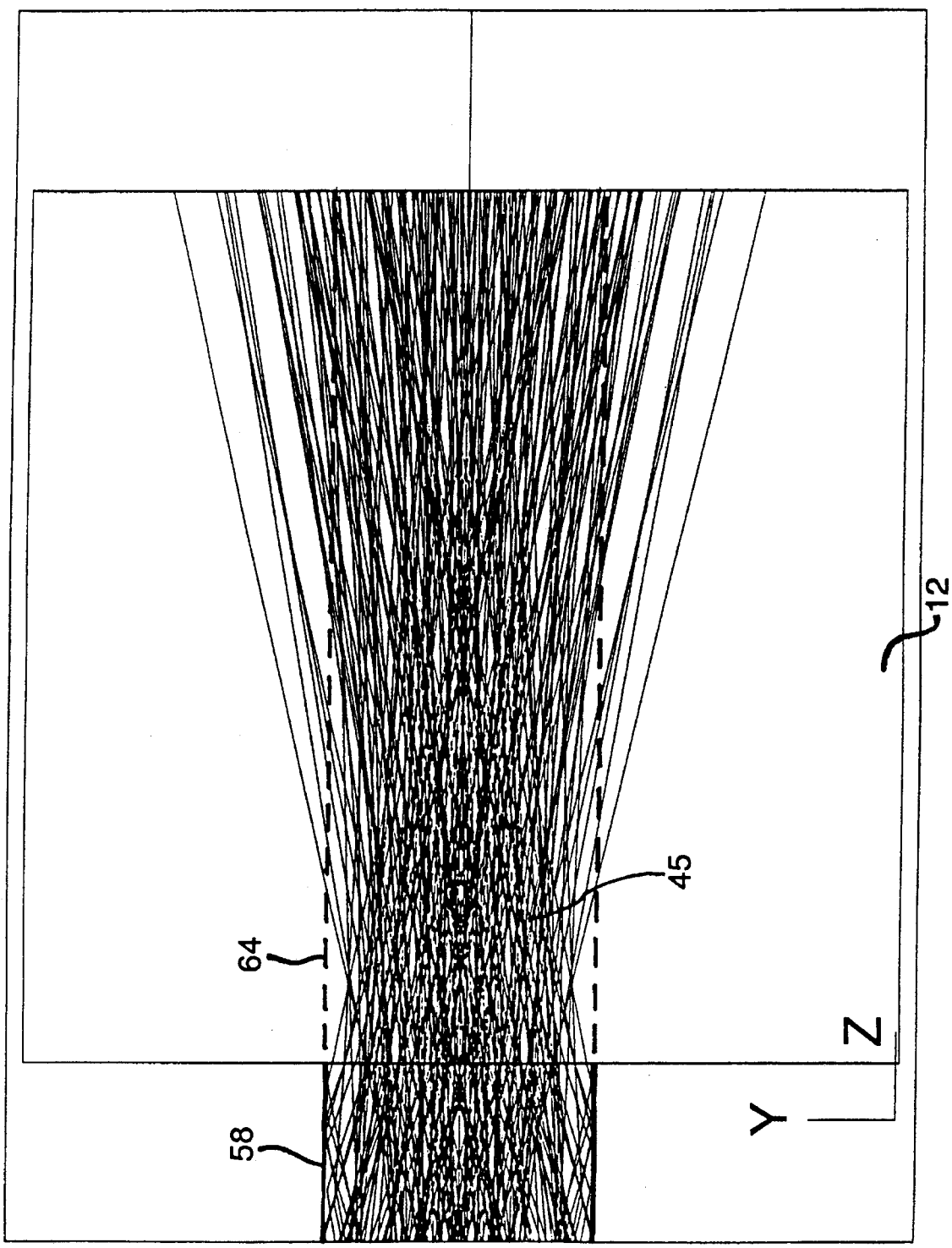
FIGS. 6A and 6B are orthogonal enlarged cross-sectional views of a nonimaging concentrator coupled to a lasant as provided by the present invention, showing the efficient overlap between the pumping beam and the lasant mode volume.
Figure 6B:
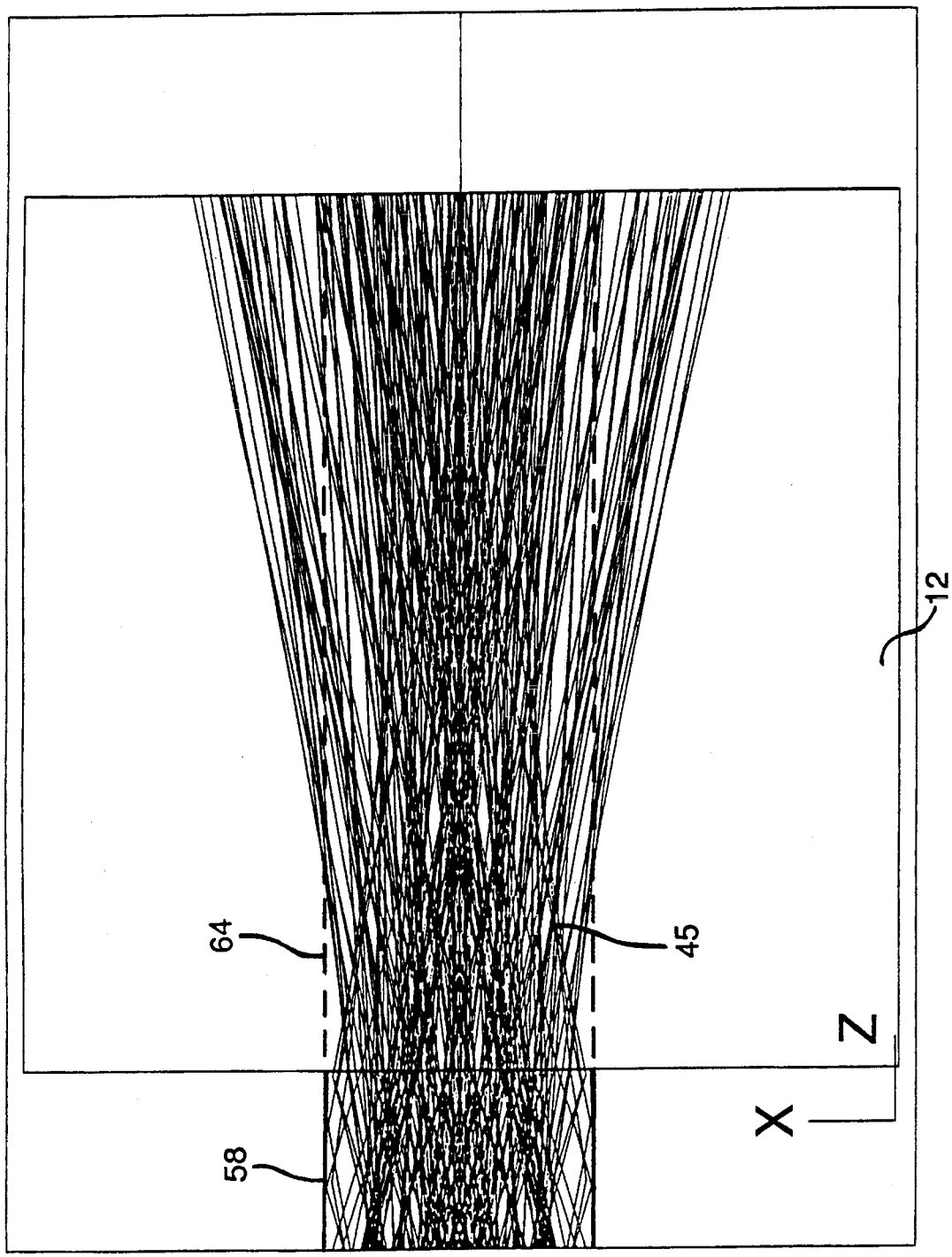

FIGS. 6A and 6B are enlarged orthogonal cross-sectional views of nonimaging concentrator 58 coupled to lasant 12 showing, through the use of ray-trace simulation, the excellent overlap of the pumping beam 45 with the lasant mode volume 64 as provided by the present invention. FIG. 6A represents a cross-section along optic axis 16 in a plane oriented orthoganally to the epitaxial layers of high-power diode laser 40, while FIG. 6B represents a cross-section along optic axis 16 in a plane oriented parallel to the epitaxial layers. The excellent overlap is achieved in a preferred embodiment where lasant 12 is a Nd:YLF platelet having a 1.4 index of refraction and a length of 1.0 mm and where nominating concentrator 58 has input and output apertures 62 and 66 of 600 µm and 300 µm in diameter, respectively, and an index of refraction of 1.74. FIGS. 6A and 6B clearly show that pumping beam 45 can be made to have low and nearly equal divergence in orthogonal directions in lasant mode volume 64. An airgap of about 10 µm between nonimaging concentrator 58 and lasant 12 is not shown in FIGS. 6A and 6B.

In an alternate embodiment, microcylindrical lens 60 is an independent lens, fabricated from sapphire or similar index material and positioned between nonimaging concentrator 58 and diode laser 40. The nonimaging coupling of pumping beam 45 from laser diode 40 into lasant mode volume 64 results in an effective overlap of pumping beam 45 with lasant mode volume 64, thus minimizing losses which would otherwise occur through divergence of the pumping beam outside lasant mode volume 64.

Experiments have demonstrated that the coupling process described above for the preferred embodiment achieves 67% coupling efficiency in the absence of antireflection coatings on microcylindrical lens 60 and output aperture 66. Coupling efficiency of greater than 81% can be expected with application of antireflection coatings. This coupling efficiency allows for generation of very high excited ion density within lasant mode volume 64, i.e., excitation substantially greater than 1% of the active ions in lasant mode volume 64.

Figure 7:
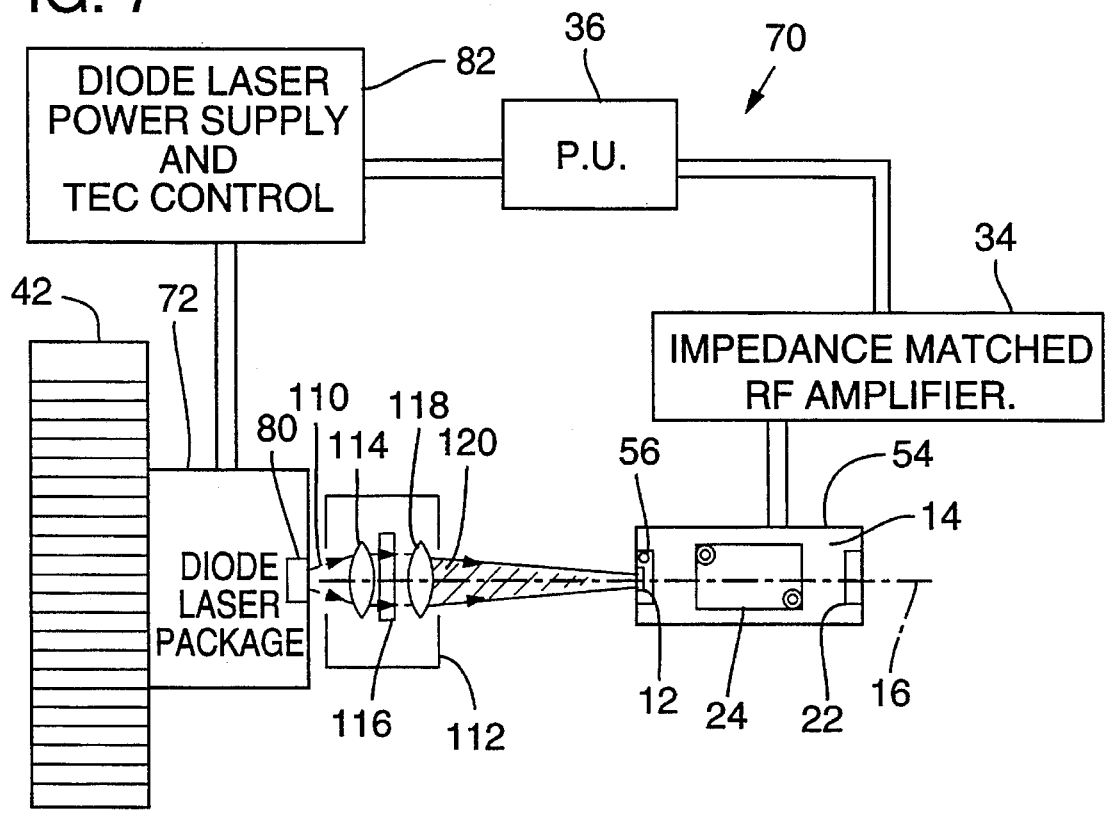
FIG. 7 shows a partly schematic plan view of an alternative embodiment of a laser system employing an unstable resonator semiconductor laser (URSL) and a short-length lasant.

FIG. 7 shows a partly schematic plan view of an alternative embodiment of a laser system 70 having a diode laser package 72 that substitutes a high-power unstable resonator semiconductor laser (URSL) 80 for diode laser 40 and nonimaging concentrator 58. For convenience, certain elements in FIG. 7 are labeled with reference numerals that correspond to similar elements in FIG. 2 even though these elements may not be identical in dimension or composition to those described for FIG. 2. State-of-the-art high power URSLs 80 are described in U.S. Pat. No. 5,260,963 of Baird and DeFreez, which issued on Nov. 9, 1993, and U.S. patent application Ser. No. 08/251,475 of Baird and DeFreez for Optical Nonlinear Waveguide Pumped by Unstable Resonator Semiconductor Laser, which was filed on May 31, 1994, both of which are incorporated herein by reference.

With reference to FIG. 7, laser system 70 preferably includes a power supply and thermal electric cooling (TEC) control 82 for supplying electrical current to URSL 80. High-power URSL 80 is positioned so that its optic axis 84 (FIGS. 8A and 8B) is preferably coaxial to an optic axis 16 extending through resonator cavity 14.

Figure 8A:
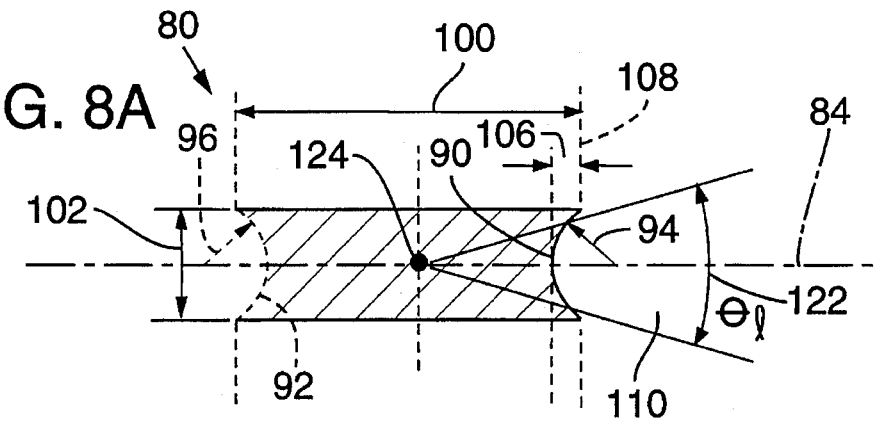
FIGS. 8A and 8B are respective enlarged plan and side elevation illustrations of an URSL incorporated in the laser system of FIG. 7.
Figure 8B:
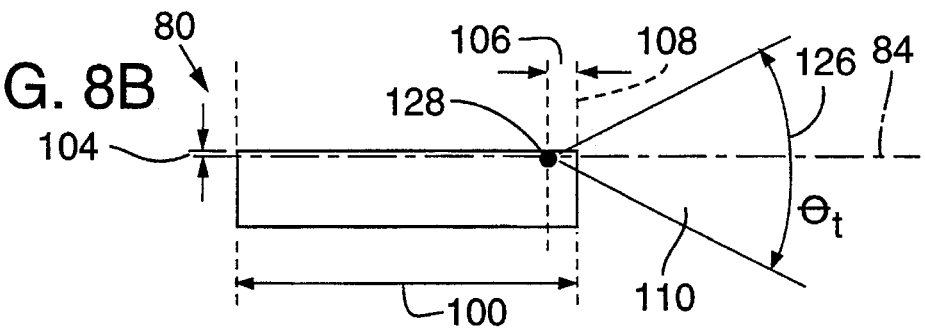

With reference to FIGS. 8A and 8B, high-power URSL 80 can be fabricated by focused ion beam micromachining, as described in Tilton, . . . DeFreez, et al., of one or both mirrors 90 and 92 and to provide mirror surfaces with respective radii of curvature 94 and 96 such that the combination of mirror curvatures 94 and 96 imparts a greater than unity lateral magnification to an optical field propagating within high-power URSL 80. For example, high-power URSL 80 may be a broad-area, high-power AlGaAs semiconductor diode laser that typically emits at wavelengths in the range 700 nm to 880 nm. Such a high-power URSL 80 may have a cavity length 100 of 500 µm, an active area width 102 of 200 µm, an active area thickness 104 of 0.005–0.2 µm, and a mirror 92 with a circular radius of curvature 96 of infinity. Mirror 90 of 300 µm of such a high-power URSL 80 may be micromachined to have a circular radius of curvature 94 of 2200 µm with maximum sag depth 106 of 5.1 µm along URSL optical axis 84 with respect to the unmachined mirror plane 108. Such a high-power URSL 80 may have a resonator magnification of 2.5. URSL 80 may, for example, generate optical output 110 of greater than 50 mW or of even greater than 1 W.

Unlike conventional high-power diode lasers and arrays of diode lasers, high-power URSL 80 exhibits lateral spatial coherence as well as transverse spatial coherence. This improvement in spatial coherence results in high-power URSL 80 generating a high-power optical output 110 that is efficiently coupled via a lens system 112 into lasant 12. Lens system 112 includes, for example, a collimating lens 114, a cylindrical lens 116, and an objective lens 118 that subsequently focuses optical output 110 to form a pumping beam 120 with a radius and depth of focus selected to be well-matched to the mode volume of lasant 12. Alternatively, a nonimaging concentrator 58 may be substituted for lens system 112, or URSL 80 may be directly coupled to lasant 12.

Analyses suggest that adjustments to the radii of curvature 94 and 96 of the respective mirrors 90 and 92, in combination with adjustments to the cavity length 100, can modify lateral divergence angle 122 originating from virtual point source 124 in the lateral plane to make angle 122 substantially equal to transverse divergence angle 126 originating from real point source 128 in the transverse plane of high-power URSL 80. Such adjustments may also modify the resonator magnification. Persons skilled in the art will appreciate that URSL 80 may contain a distributed feedback grating or a distributed Bragg reflector.

Skilled persons will appreciate that high-power URSL 80 can be composed of a variety of other light-emitting semiconductor material such as, for example, InGaAsP, InGaAs, or AlGaInP and that lasant 12 can be composed of a variety of other preferable other highly-doped platelet crystals such as, for example, Cr:LiSrAlF$_6$, Cr:LiCaAlF$_6$, or any chromium-doped fluoride composition of Cr$^{3+}$:XYZF$_6$ composition wherein X is selected from Li$^+$, Na$^+$, K$^+$, and Rb$^+$, Y is selected from Ca$^{2+}$, Sr$^{2+}$, Ba$^{2+}$, Cd$^{2+}$, and Mg$^{2+}$, and Z is selected from Al$^{3+}$, Ga$^{3+}$, and Sc$^{3+}$.

The high density of excited active ions in lasant mode volume 64 induces Auger or Anti-stokes mechanisms such as ion-ion interactions and two-photon absorption mechanisms that enhance transitions of excited active ions from the metastable excitation state, and thereby reduces the effective fluorescence lifetime of excited active ions in lasant mode volume 64.

The reduction of the effective fluorescence lifetime of excited active ions in lasant mode volume 64 provided by the present invention permits a reduction of the roll-off in pulse energy as PRF is increased. Thus, a Q-switched laser system of the present invention can generate high peak power pulses having comparable magnitude over a wide range of pulse repetition frequencies. Moreover, a Q-switched laser system of the present invention can operate at greater than twice the PRF of a conventional DRAM processing system while exhibiting no significant roll-off in energy per pulse. It is further noted that despite the highly divergent and astigmatic nature of the pumping beam produced by diode laser 40, the preferred embodiment permits a mode radius of less than 200 μm.

In an alternative embodiment of this invention, lasant 12 is, for example, Nd:YLF grown in fiber form, such as by the Laser-Heated Pedestal Growth method, and has a diameter less than or equal to 500 μm and a length of less than 1.25 mm. In this embodiment lasant 12 acts as a mode-selecting element to support $TEM_{00}$ mode operation.

It will be obvious to those having skill in the art that various changes may be made in the details of the above-described embodiments of the present invention without departing from the underlying principles thereof. For example, nonimaging concentrator 58 can be fabricated with a compound parabolic taper instead of the linear taper previously described. Alternatively, the input aperture 62 and taper of nonimaging concentrator 58 can be modified to efficiently couple the output power from diode lasers with emitting dimensions of 200 μm or greater.

Although use of a nonimaging concentrator 58 is the preferred method for coupling pumping beam 45 into lasant mode volume 64, a person skilled in the art will appreciate that output from a diode laser having 2.0 watts or greater output and emitter dimensions of 200 microns or less can be alternatively collected by a collimating lens and subsequently focused using a second lens into lasant mode volume 64 to generate sufficient excited active ion density. In addition, a person skilled in the art will also recognize that embodiments of the present invention may be employed to operate in a continuous wave mode. The scope of the present invention should be determined, therefore, only by the following claims.

We claim:

1. A method for pumping a lasant including a mode volume having an absorption coefficient, a length along an optic axis, and active ions that are excitable to a metastable excitation state in which excited ions have an effective fluorescence lifetime, the method comprising:

generating a pumping bean having a high degree of lateral and spatial coherence at a pumping rate $\omega_p$;

optically pumping with the pumping beam a nonstoichiometric lasant in which the mode volume has an active ion concentration of greater than 1%;

concurrently exciting greater than 1% of the active ions in the mode volume to the metastable excitation state, in which a solitary ion has a fluorescence lifetime $\tau_f$, to induce concentration-dependent depopulation mechanisms corresponding to a parameter B in addition to spontaneous and stimulated emission from the metastable excitation state, such that the inverse of a parameter "a" represents an effective fluorescence lifetime of excited active ions in the metastable excitation state, where parameter "a" is generally expressed as $$a = (1/\tau_f + \omega_p + B),$$

thereby reducing the effective fluorescence lifetime of excited active ions in the metastable excitation state; and employing a Q-switch to generate from the lasant substantially high peak power pulses having comparable magnitudes over a wide range of pulse repetition frequencies (PRFs) such that a dependence of energy per pulse on a PRF is generally expressed as $E_1 = E_0(1 - e^{-at})$, wherein $E_0$ represents the energy per pulse at a PRF that is less than 10 Hz and $E_1$ represents the energy per pulse at a PRF given by the inverse of an interpulse period t.

2. The method of claim 1 in which the concentration of excited active ions within the lasant mode volume induces concentration-dependent depopulation mechanisms including but not limited to ion-ion interactions and two-photon absorption.

3. The method of claim 1 in which the optically pumping step employs a diode laser that generates greater than about 1 watt of power.

4. The method of claim 1 in which the optically pumping step includes efficiently coupling light generated by a pumping source into the lasant mode volume.

5. The method of claim 1 in which the lasant comprises Nd:YLF.

6. The method of claim 1 in which the lasant comprises a platelet.

7. The method of claim 1 in which the optically pumping step further comprises employing an unstable resonator semiconductor laser.

8. The method of claim 1 in which the PRF is greater than 1 kHz and the energy per pulse varies by less than 5%.

9. The method of claim 1 in which the optical pumping is employed in continuous wave mode.

10. The method of claim 1 in which a nonimaging concentrator is positioned between a pumping source and the lasant and comprises a high refractive index, crystalline dielectric material to efficiently couple the light into the lasant.

11. The method of claim 2 further comprising:

sufficiently reducing the effective fluorescence lifetime to maintain high peak power pulses over the wide range of repetition frequencies thereby substantially eliminating roll-off energy per pulse.

12. The method of claim 1 further comprising performing OTF repair on DRAMs at a PRF greater than 1 kHz.

13. A laser system for generating substantially high peak power pulses having comparable magnitudes over a wide range of pulse repetition frequencies, comprising:

a nonstoichiometric lasant positioned within a resonator cavity and having an absorption coefficient;

a substantially high power pumping source that generates light at a wavelength within an absorption bandwidth of the lasant at a pumping rate $\omega_p$;

a greater than 1% concentration in the lasant of active ions excitable to a metastable excitation state in which a solitary excited ion has a fluorescence lifetime of $\tau_f$;

a mode volume within the lasant having a length along an optic axis;

an optical coupler that couples the light generated by the pumping source into the mode volume, the mode volume length, active ion concentration, and pumping rate cooperating to excite greater than 1% of the active ions in the mode volume to the metastable excitation state and induce concentration-dependent depopulation mechanisms corresponding to a parameter B in addition to spontaneous and stimulated emission from the metastable excitation state, such that the inverse of a parameter "a" represents an effective fluorescence lifetime of excited active ions in the metastable excitation state, where parameter "a" is generally expressed as $$"a" = (1/\tau_f + \omega_p + B); \text{ and}$$

a Q-switch positioned within the resonator cavity for generating high peak power pulses at an energy per pulse $E_1$ at a PRF represented by the inverse of an interpulse period t, in which $E_1$ is generally expressed as $E_1 = E_0(1-e^{-at})$, where $E_0$ represents an energy per pulse at a PRF that is less than 10 Hz.

14. The laser system of claim 13 in which the pumping source comprises a diode laser that generates greater than 1 watt of power.

15. The laser system of claim 13 in which the lasant comprises Nd:YLF.

16. The laser system of claim 13 in which the lasant comprises a platelet.

17. The laser system of claim 13 in which the pulse repetition frequencies exceed 1000 Hz.

18. The laser system of claim 13 in which the laser pulses are suitable for OTF repair of DRAMs at a very high PRF.

19. The laser system of claim 13 in which it is operable in continuous wave mode.

20. The laser system of claim 13 in which a nonimaging concentrator is positioned between the pumping source and the lasant and comprises a high refractive index, crystalline dielectric material to efficiently couple the light into the lasant.

21. The laser system of claim 20 in which the lasant comprises a platelet and the nonimaging concentrator is end-coupled to the lasant.

22. The laser system of claim 13 in which the parameter B concentration-dependent depopulation mechanisms comprise Auger, ion-ion, or two-photon absorption interactions.

23. The laser system of claim 13 in which the pumping source comprises an unstable resonator semiconductor laser.

24. The laser system of claim 13 in which the PRF is greater than 1 kHz and the energy per pulse varies by less than 5%.

* * * * *